United States Patent
Shinohara et al.

(10) Patent No.: US 7,632,553 B2
(45) Date of Patent: *Dec. 15, 2009

(54) METHOD OF TREATING INORGANIC OXIDE FILM, ELECTRONIC DEVICE SUBSTRATE, METHOD OF MANUFACTURING ELECTRONIC DEVICE SUBSTRATE, LIQUID CRYSTAL PANEL, AND ELECTRONIC APPARATUS

(75) Inventors: Yuji Shinohara, Suwa (JP); Koichi Terao, Suwa (JP)

(73) Assignee: Seiko Epson Corporation (JP)

( * ) Notice: Subject to any disclaimer, the term of this patent is extended or adjusted under 35 U.S.C. 154(b) by 526 days.

This patent is subject to a terminal disclaimer.

(21) Appl. No.: 11/406,248

(22) Filed: Apr. 18, 2006

(65) Prior Publication Data
US 2006/0231839 A1 Oct. 19, 2006

(30) Foreign Application Priority Data
Apr. 19, 2005 (JP) ............................. 2005-120766

(51) Int. Cl.
*G02F 1/1337* (2006.01)
(52) U.S. Cl. ........................................ 428/1.2; 349/125
(58) Field of Classification Search ................. 428/1.2; 349/123–135
See application file for complete search history.

(56) References Cited

U.S. PATENT DOCUMENTS

| 4,030,997 | A | * | 6/1977 | Miller et al. | ........... 204/192.34 |
| 5,011,267 | A | * | 4/1991 | Miller et al. | ................ 349/125 |
| 5,350,498 | A | * | 9/1994 | Smith et al. | ........... 204/192.23 |
| 6,320,635 | B1 | | 11/2001 | Matsui | |
| 7,473,449 | B2 | * | 1/2009 | Shinohara et al. | ............. 428/1.2 |

FOREIGN PATENT DOCUMENTS

| JP | 05-203958 | 8/1993 |
| JP | 11-160711 | 6/1999 |
| JP | 2000-047211 | 2/2000 |

* cited by examiner

*Primary Examiner*—David R Sample
*Assistant Examiner*—Sophie Hon
(74) *Attorney, Agent, or Firm*—Harness, Dickey & Pierce, P.L.C.

(57) ABSTRACT

A method of treating an inorganic oxide film includes: dipping an inorganic oxide film having a plurality of pores therein which is formed by an oblique deposition method into a treatment liquid containing alcohol; reducing pressure of a space where the treatment liquid is provided to infiltrate the treatment liquid into the pores of the inorganic oxide film; and chemically bonding the alcohol to a surface of the inorganic oxide film and inner surfaces of the pores.

1 Claim, 7 Drawing Sheets

METHOD OF TREATING INORGANIC OXIDE FILM, ELECTRONIC DEVICE SUBSTRATE, METHOD OF MANUFACTURING ELECTRONIC DEVICE SUBSTRATE, LIQUID CRYSTAL PANEL, AND ELECTRONIC APPARATUS

BACKGROUND

1. Technical Field

The present invention relates to a method of manufacturing an inorganic oxide film, to an electronic device substrate, to a method of manufacturing an electronic device substrate, to a liquid crystal panel, and to an electronic apparatus.

2. Related Art

In recent years, vertical-alignment-type liquid crystal display devices have been used for liquid crystal televisions (direct-view-type display apparatuses) and liquid crystal projectors (projection display apparatuses).

For example, organic alignment films formed of polyimide and oblique deposition films (inorganic oxide films) formed of, for example, $SiO_2$ are generally used as the vertical alignment films of the vertical-alignment-type liquid crystal display devices. More specifically, the organic alignment films are used for the liquid crystal televisions, and the oblique deposition films are used for the liquid crystal projectors.

The oblique deposition film made of an inorganic oxide has a plurality of pores, and a plurality of polarized hydroxyl groups exist on the surface of the oblique deposition film and the inner surfaces of the pores. This hydroxyl group has activity as a Broensted acid, and is apt to absorb or react with liquid crystal molecules or impurities contained in a liquid crystal display device, particularly, a compound having a polar group.

The following are included in the impurities: impurities and unreacted ingredients contained in a sealing material; impurities and water contained in a liquid crystal layer; and dust generated from the manufacturing process.

It has been known that, when impurities are stuck onto or react with the surface of the oblique deposition film, the shape or polarity of the surface is changed to cause vertical anchoring force to be weakened, which results in the abnormal alignment of the liquid crystal molecules. In this case, it has also been known that the liquid crystal molecules directly react with the hydroxyl group.

Therefore, a method of treating the surface of the oblique deposition film (inorganic oxide film) with a higher alcohol or a silane coupling agent has been proposed as a method of reforming the surface of the oblique deposition film (for example, see JP-A-11-160711 and JP-A-5-203958).

In the method disclosed in JP-A-11-160711, an oblique deposition film formed of $SiO_2$ is exposed to vapor of a higher alcohol.

Therefore, in this method, since a processing temperature is low, the higher alcohol is just physically stuck to the oblique deposition film, which results in excessively weak bonding force. Thus, when coming into contact with the liquid crystal molecules, the higher alcohol is easily separated from the surface of the oblique deposition film, which makes it difficult to obtain stable vertical alignment force in an initial state.

Further, in the method disclosed JP-A-5-203958, octadecyl dimethyl(3-(trimethoxysilyl)propyl)ammonium chloride, which is a silane coupling agent, is applied (comes into contact) as a vertical alignment agent on the oblique deposition film formed of $SiO_2$ which is deposited under the assistance of ion beams. Then, the oblique deposition film is baked at a temperature of 110° C. for one hour.

However, in this case, the pores (openings) have a small diameter, and the mere contact between the silane coupling agent and the oblique deposition film causes only the hydroxyl group on the surface to be chemically bonded. That is, it is difficult to chemically bond the silane coupling agent to the hydroxyl group existing in the pores.

Therefore, the method disclosed in JP-A-5-203958 has a problem in that the alignment of the liquid crystal molecules is deteriorated in a relatively short time due to the influence of the hydroxyl group existing in the pores of the oblique deposition film.

SUMMARY

An advantage of some aspects of the invention is that it provides a method of treating an inorganic oxide film capable of reliably forming a chemical bond between alcohol and both the surface of the inorganic oxide film and the inner surfaces of pores provided in the inorganic oxide film, an electronic device substrate capable of preventing the alignment of liquid crystal molecules from being deteriorated with the passage of time, a method of manufacturing the electronic device substrate, a liquid crystal panel having high reliability, and an electronic apparatus having high reliability.

According to an aspect of the invention, a method of treating an inorganic oxide film includes: dipping an inorganic oxide film having a plurality of pores therein which is formed by an oblique deposition method into a treatment liquid containing alcohol; reducing pressure of a space where the treatment liquid is provided to infiltrate the treatment liquid into the pores of the inorganic oxide film; and chemically bonding the alcohol to a surface of the inorganic oxide film and inner surfaces of the pores.

In this way, it is possible to reliably form a chemical bond between alcohol and both the surface of the inorganic oxide film and the inner surfaces of the pores provided in the inorganic oxide film.

According to another aspect of the invention, an electronic device substrate includes: a substrate; and an alignment film that is formed on a surface of the substrate. In the electronic device substrate, the alignment film is formed by chemically bonding alcohol to a surface of an inorganic oxide film having a plurality of pores therein which is formed by an oblique deposition method and inner surfaces of the pores.

In this way, it is possible to obtain an electronic device substrate in which the alignment characteristics of liquid crystal molecules are not deteriorated with the passage of time.

According to still another aspect of the invention, there is provided a method of manufacturing an electronic device substrate including a substrate and an alignment film formed on a surface of the substrate. The method includes: forming an inorganic oxide film having a plurality of pores on the surface of the substrate by an oblique deposition method; dipping the substrate having the inorganic oxide film formed thereon into a treatment liquid containing alcohol; reducing pressure of a space where the treatment liquid is provided to infiltrate the treatment liquid into the pores of the inorganic oxide film; and chemically bonding the alcohol to a surface of the inorganic oxide film and inner surfaces of the pores to form the alignment film.

In this way, it is possible to reliably form a chemical bond between alcohol and both the surface of the inorganic oxide film and the inner surfaces of the pores provided in the inorganic oxide film.

In the method of manufacturing an electronic device substrate according to this aspect, it is preferable that the alcohol have 2 to 30 carbon atoms.

In this way, even when the alcohol having the carbon atom number is in a liquid state or a semisolid state (solid state) at room temperature, it is possible to liquefy the semisolid alcohol at a relatively low temperature. Therefore, it is possible to easily treat an inorganic oxide film with a treatment liquid.

In the method of manufacturing an electronic device substrate according to this aspect, it is preferable that the alcohol be an aliphatic alcohol or a fluoride-substituted product thereof.

In this way, since the aliphatic alcohol or the fluoride-substituted product thereof has a molecular structure close to a linear shape, it can be deeply infiltrated into the pores of the inorganic oxide film.

In the method of manufacturing an electronic device substrate according to this aspect, it is preferable that, in the infiltrating of the treatment liquid, the vacuum of the space be in the range of $1\times10^{-4}$ Pa to $1\times10^{4}$ Pa.

In this way, air is reliably removed from the pores of the inorganic oxide film, which makes it possible to infiltrate a sufficient amount of treatment liquid into the pores.

In the method of manufacturing an electronic device substrate according to this aspect, it is preferable that the substrate be heated to chemically bond the inorganic oxide film to the alcohol.

The heating makes it possible to easily and reliably perform a reaction between the alcohol and the hydroxyl groups existing in the surface of the inorganic oxide film and the inner surfaces of the pores.

In the method of manufacturing an electronic device substrate according to this aspect, it is preferable that the substrate be heated at a temperature of 80° C. to 250° C.

In this way, it is possible to reliably form a sufficient chemical bond between the alcohol and the inorganic oxide film, regardless of the kind of alcohol or inorganic oxide.

In the method of manufacturing an electronic device substrate according to this aspect, it is preferable that the substrate be heated for 20 to 180 minutes.

In this way, it is possible to reliably form a chemical bond between the alcohol and the inorganic oxide film, regardless of conditions, such as a heating temperature.

According to still yet another aspect of the invention, a liquid crystal panel includes the above-mentioned electronic device substrate; and a liquid crystal layer which is provided on a surface of the substrate opposite to the alignment film.

In this way, it is possible to obtain a liquid crystal panel having high reliability.

According to yet still another aspect of the invention, a liquid crystal panel includes a pair of the electronic device substrates; and a liquid crystal layer which is interposed between the alignment films of the pair of electronic device substrates.

In this way, it is possible to obtain a liquid crystal panel having high reliability.

According to still yet another aspect of the invention, an electronic apparatus includes the above-mentioned liquid crystal panel.

In this way, it is possible to obtain an electronic apparatus having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method of processing an inorganic oxide film, an electronic device substrate, a method of manufacturing an electronic device substrate, a liquid crystal panel, and an electronic apparatus according to the invention will be described below with reference to the accompanying drawings.

First, the liquid crystal panel according to the invention will be described below.

First Embodiment

A first embodiment of the liquid crystal panel according to the invention will be described below.

Figure 1:
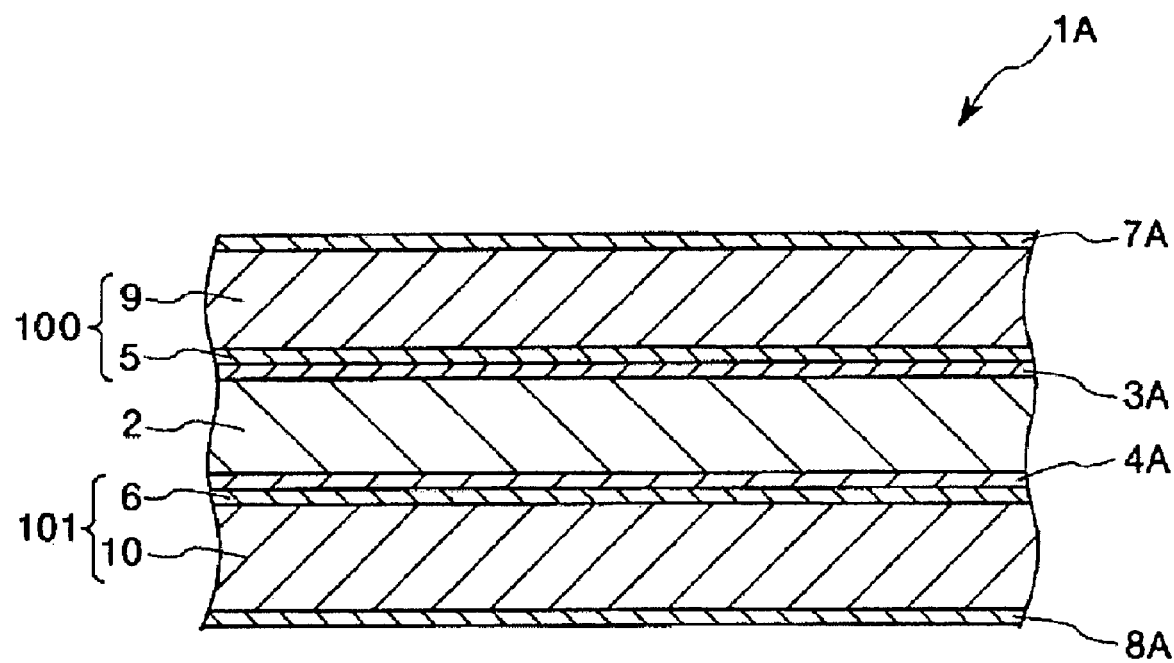
FIG. 1 is a longitudinal cross-sectional view schematically illustrating a first embodiment of a liquid crystal panel of the invention.
Figure 2:
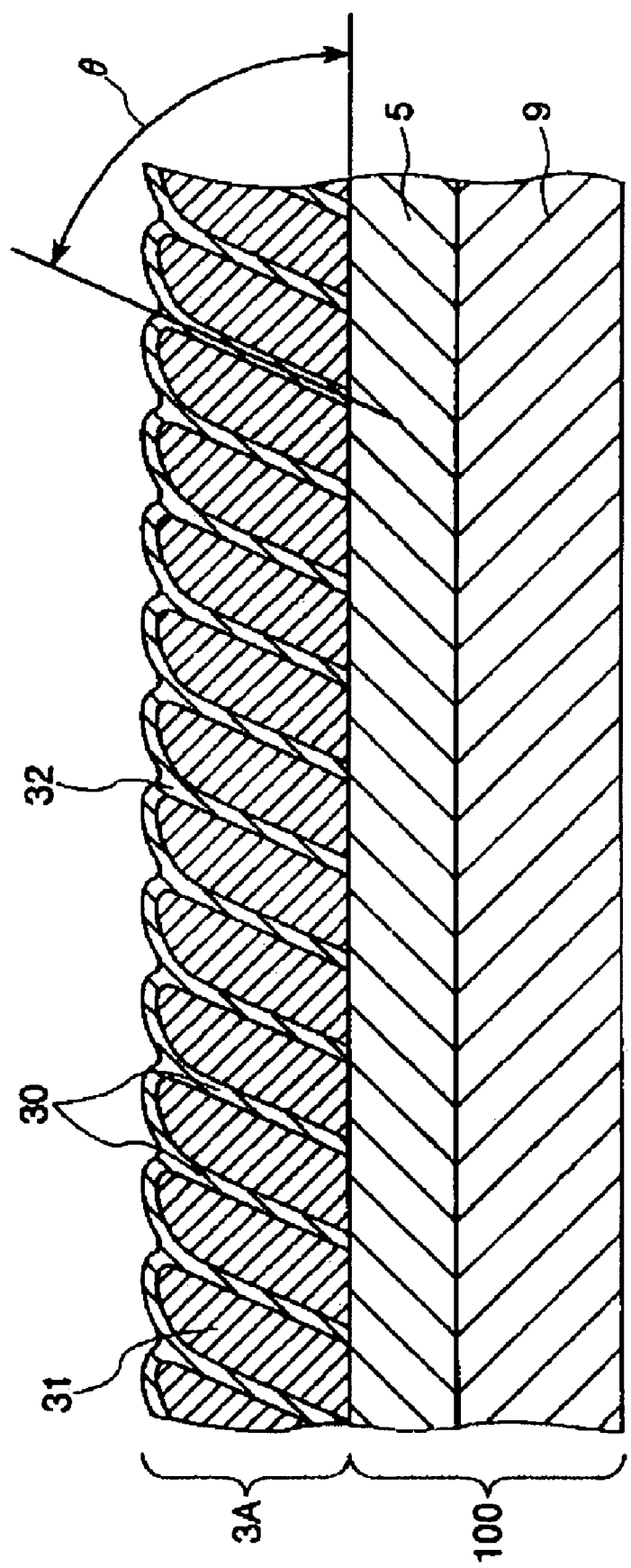
FIG. 2 is a longitudinal cross-sectional view schematically illustrating the structure of an alignment film provided in the liquid crystal panel shown in FIG. 1.

FIG. 1 is a longitudinal cross-sectional view schematically illustrating the first embodiment of the liquid crystal panel according to the invention. FIG. 2 is a longitudinal cross-sectional view schematically illustrating the structure of an alignment film included in the liquid crystal panel shown in FIG. 1. In FIG. 1, for example, a sealing material and wiring lines are not shown. In addition, in the following description, upper parts of FIGS. 1 and 2 are referred to as upper sides, and lower parts thereof are referred to as lower sides.

A liquid crystal panel 1A shown in FIG. 1 includes a liquid crystal layer 2, alignment films 3A and 4A, transparent conductive films 5 and 6, polarizing films 7A and 8A, and substrates 9 and 10.

In this structure, the substrate 9, the transparent conductive film 5 (electrode), and the alignment film 3A form an electronic device substrate of the invention, and the substrate 10, transparent conductive film 6 (electrode), and the alignment film 4A form another electronic device substrate of the invention.

In the structure shown in FIG. 1, neither the transparent conductive film 5 not the transparent conductive film 6 is divided. However, in general, at least one of the films is divided into individual electrodes (pixel electrodes).

The liquid crystal layer 2 contains liquid crystal molecules (liquid crystal material).

For example, any of the following materials is used as the liquid crystal molecules: a phenylcyclohexane derivative, a biphenyl derivative, a biphenylcycloxehane derivative, a terphenyl derivative, a phenyl ether derivative, a phenyl ester derivative, a bicyclohexane derivative, an azomethine derivative, an azoxy derivative, a pyrimidine derivative, a dioxane derivative, a cubane derivative, and materials obtained by introducing fluorine-based substituents, such as a fluoro group, a trifluoromethyl group, a trifluoromethoxy group, or a difluoromethoxy group, into these derivatives.

As will be described later, when the alignment films 3A and 4A are used, it is easy to vertically align the liquid crystal molecules. For example, compounds represented by the following chemical formulas 1 to 3 are used as the liquid crystal molecules suitable for vertical alignment:

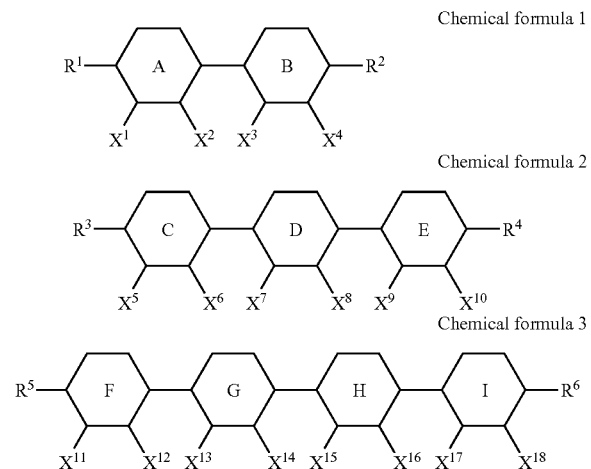

Chemical formula 1

Chemical formula 2

Chemical formula 3

(wherein rings A to I indicate cyclohexane rings or benzene rings, $R^1$ to $R^6$ indicate any one of an alkyl group, an alkoxy group, and a fluorine atom, and $X^1$ to $X^{10}$ indicate hydrogen atoms or fluorine atoms).

The alignment films 3A and 4A are arranged on both surfaces of the liquid crystal layer 2.

The alignment film 3A is formed on a base member 100 composed of the transparent conductive film 5 and the substrate 9, and the alignment film 4A is formed on a base member 101 composed of the transparent conductive film 6 and the substrate 10.

The alignment films (vertical alignment films) 3A and 4A have a function of controlling the alignment state of the liquid crystal molecules constituting the liquid crystal layer 2 (when no voltage is applied).

In addition, since the alignment films 3A and 4A have the same structure, only the alignment film 3A will be described as a representative example.

As shown in FIG. 2, the alignment film 3A is composed of an inorganic oxide film 31 formed by an oblique deposition method and a film 32 formed on the inorganic oxide film 31 by a method, which will be described later.

As shown in FIG. 2, since the inorganic oxide film 31 is formed by the oblique deposition method, it has a plurality of pores 30 therein, and each of the pores is uniaxially arranged such that its axis is inclined with respect to an upper surface of the base member 100 (a surface having the alignment film 3A formed thereon).

In this structure, that the axis of each of the pores 30 is uniaxially arranged means that almost all the pores 30 are inclined in the same direction (the average directions of the pores 30 are controlled). Some of the pores 30 may be inclined in a direction different from the direction in which the other pores 30 are inclined.

The pores 30 regularly arranged cause the inorganic oxide film 31 (the alignment film 3A) to have high regularity in structure.

This structure makes it easy for the liquid crystal molecules contained in the liquid crystal layer 2 to be vertically aligned (homeotropic alignment). Therefore, the alignment film 3A having this structure is useful for a VA (vertical alignment) liquid crystal panel.

Since the alignment film 3A has high regularity in structure, the liquid crystal molecules are accurately arranged in a fixed direction (vertical direction), which results in an improvement in the performance (characteristic) of the liquid crystal panel 1A.

Further, an angle (an angle θ in FIG. 2) formed between the pores 30 and the upper surface of the base member 100 is preferably in the range of 30° to 70°, more preferably, in the range of 40° to 60°. However, the angle is not limited to the above-mentioned angular range. In this way, it is possible to reliably arrange the liquid crystal molecules in the vertical direction.

The inorganic oxide film 31 is a film having an inorganic oxide as a main ingredient. In general, an inorganic material has higher chemical stability (optical stability) than an organic material. Therefore, the inorganic oxide film 31 (the alignment film 3A) has higher light resistance than an alignment film formed of an organic material.

It is also preferable that the inorganic oxide forming the inorganic oxide film 31 have a relatively small dielectric constant, which makes it possible to effectively prevent the irregularity of images displayed on the liquid crystal panel 1A.

For example, any of the following materials is used as the inorganic oxide: silicon oxides, such as $SiO_2$ and $SiO$, metallic oxides, such as $Al_2O_3$, $MgO$, $TiO$, $TiO_2$, $In_2O_3$, $Sb_2O_3$, $Ta_2O_5$, $Y_2O_3$, $CeO_2$, $WO_3$, $CrO_3$, $GaO_3$, $HfO_2$, $Ti_3O_5$, $NiO$, $ZnO$, $Nb_2O_5$, $ZrO_2$, and $Ta_2O_5$, and combinations of two or more materials of them. In particular, it is preferable to use, as the inorganic oxide, a material having $SiO_2$ as a main ingredient. $SiO_2$ has a small dielectric constant and high optical stability.

The film 32 is formed on the surface of the inorganic oxide film 31 and the inner surfaces of the pores 30.

The film 32 is formed by treating the inorganic oxide film 31 with a treatment liquid, which will be described later. That is, the film 32 is formed by chemically reacting (etherifying) an active hydroxyl group existing in the surface of the inorganic oxide film 31 and the inner surfaces of the pores 30 with a hydroxyl group having alcohol, and is mainly formed of a main skeletal portion of alcohol.

The alcohol used in this embodiment preferably has 2 to 30 carbon atoms, more preferably, 3 to 18 carbon atoms. Even when the alcohol having the carbon atom numbers is in a liquid state or a semisolid state (solid state) at room temperature, it can turn to a liquid state at a relatively low temperature. Therefore, when the inorganic oxide film 31 is treated with a treatment liquid, which will be described later, it is possible to easily treat the inorganic oxide film 31.

Since the alcohol having the carbon atom numbers has a relatively small molecular size, it can be deeply infiltrated into the pores 30, which makes it possible to further reduce the number of active hydroxyl groups existing in the surface of the inorganic oxide film 31 and the inner surfaces of the pores 30. Therefore, it is possible to prevent various impurities from being stuck to the inorganic oxide film 31 and to prevent the inorganic oxide film 31 from reaction with the liquid crystal molecules. Thus, for example, it is possible to prevent the vertical anchoring force of the alignment film 3A with respect to the liquid crystal molecules from being weakened and thus to prevent alignment abnormality from occurring in the liquid crystal molecules.

In addition, any of the following materials may be used as the alcohol: an aliphatic alcohol, an aromatic alcohol, an alicyclic alcohol, a heterocyclic alcohol, a polyvalent alcohol, and halogen-substituted products thereof (in particular, fluorine-substituted products). Among them, the aromatic alcohol, the alicyclic alcohol, or the fluorine-substituted product thereof (fluoroalcohol) is preferable. Since the aliphatic alcohol or the fluorine-substituted product thereof has a molecular structure close to a straight line, it can be deeply infiltrated into the pores 30, which makes it possible to further improve the above-mentioned effect.

The use of the aliphatic alcohol or the fluorine-substituted product thereof causes a hydrocarbon portion thereof, which is a main skeleton portion, or a fluoridized carbon portion thereof to be chemically bonded to the surface of the inorganic oxide film 31 through the liquid crystal layer 2. In this way, it is possible to strengthen the vertical anchoring force with respect to the liquid crystal molecules and to reliably align the liquid crystal molecules in the vertical direction.

Any of the following materials may be used as the alcohol in consideration of the above-mentioned factors: propanol, butanol, pentanol, hexanol, heptanol, octanol, nonanol, decanol, undecanol, dodecanol, tridecanol, tetradecanol, pentadecanol, hexadecanol, heptadecanol, and octadecanol.

The aliphatic alcohol or the fluoride-substituted product thereof may have a linear or branch-shaped hydrocarbon portion or fluoridized carbon portion (main skeleton portion).

In addition to the above-mentioned materials, any of the following materials can be used as the alcohol: aliphatic alcohols, such as ethanol, eicosanol, heneicosanol, docosanol, tricosanol, tetracosanol, and triacontanol; aromatic alcohols such as phenol, benzyl alcohol and p-chlorobenzyl alcohol; alicyclic alcohols, such as cyclohexanol, 4-methylcyclohexanol, cyclopentanol, cholesterol, epicholesterol, cholestanol, epicholestanol, ergostanol, epiergostanol, coprostanol, epicoprostanol, α-ergosterol, β-sitosterol, stigmasterol and campesterol; a heterocyclic alcohol, such as furfuryl alcohol; a polyhydric alcohol, such as ethylene glycol and glycerin; and fluorine-substituted products thereof.

Since a large number of liquid crystal molecules are fluoridized, the used of the fluorine-substituted products makes it possible to improve an affinity for the liquid crystal molecules and thus to reliably arrange the liquid crystal molecules in the vertical direction.

The alignment film 3A has an average thickness of about 20 to 300 nm, preferably, about 20 to 150 nm, and more preferably, 20 to 80 nm, but the average thickness is not limited to the above-mentioned values. When the thickness of the alignment film 3A is excessively small, the liquid crystal molecules come into direct contact with the transparent conductive films 5 and 6, which makes it difficult to prevent the contact therebetween. On the other hand, when the thickness of the alignment film 3A is excessively large, a high voltage is needed to drive the liquid crystal panel 1A, resulting in an increase in power consumption.

The transparent conductive film 5 is arranged on the outer surface (the upper surface in FIG. 1) of the alignment film 3A. Similarly, the transparent conductive film 6 is arranged on the outer surface (the lower surface in FIG. 1) of the alignment film 4A.

The transparent conductive films 5 and 6 have a function of changing the alignment directions of the liquid crystal molecules contained in the liquid crystal layer 2 by performing charge or discharge therebetween.

The charge or discharge between the transparent conductive films 5 and 6 is controlled by adjusting a current supplied from a control circuit (not shown) connected to the transparent conductive films 5 and 6.

The transparent conductive films 5 and 6 are formed of a conductive material, such as indium tin oxide (ITO), indium oxide (IO), or tin oxide ($SnO_2$).

The substrate 9 is arranged on the outer surface (the upper surface in FIG. 1) of the transparent conductive film 5. Similarly, the substrate 10 is arranged on the outer surface (the lower surface in FIG. 1) of the transparent conductive film 6.

The substrates 9 and 10 have functions of supporting the liquid crystal layer 2, the alignment films 3A and 4A, the transparent conductive films 5 and 6, and the polarizing films 7A and 8A, which will be described later.

The substrates 9 and 10 are formed of various glass materials, such as quartz glass, and various plastic materials, such as polyethylene terephthalate. Among these materials, particularly, it is preferable that the substrates 9 and 10 be formed of various glass materials. In this way, it is possible to prevent the liquid crystal panel 1A from being warped and thus improve the stability of the liquid crystal panel 1A.

The polarizing film (a polarizing plate) 7A is arranged on the outer surface (the upper surface in FIG. 1) of the substrate 9. Similarly, the polarizing film (a polarizing plate) 8A is arranged on the outer surface (the lower surface in FIG. 1) of the substrate 10.

The polarizing films 7A and 8A are formed of, for example, a polyvinyl alcohol (PVA). In addition, the polarizing films may be formed of a material obtained by doping iodine into the above-mentioned material.

For example, the polarizing films may be formed by uniaxially extending a film made of the above-mentioned material.

The polarizing films 7A and 8A makes it possible to adjust the passage of current and thus to reliably control the transmittance of light.

The directions of polarizing axes of the polarizing films 7A and 8A generally depend on the alignment directions of the alignment films 3A and 4A (in this embodiment, when a voltage is applied).

Next, a description will be made of a method of manufacturing the electronic device substrate used for the method of treating the inorganic oxide film according to the invention.

The method of manufacturing the electronic device substrate includes a process [1] of forming an inorganic oxide film, a process [2] of dipping the inorganic oxide film into a treatment liquid, a process [3] of infiltrating the treatment liquid into the inorganic oxide film, and a reacting process [4].

Figure 3:
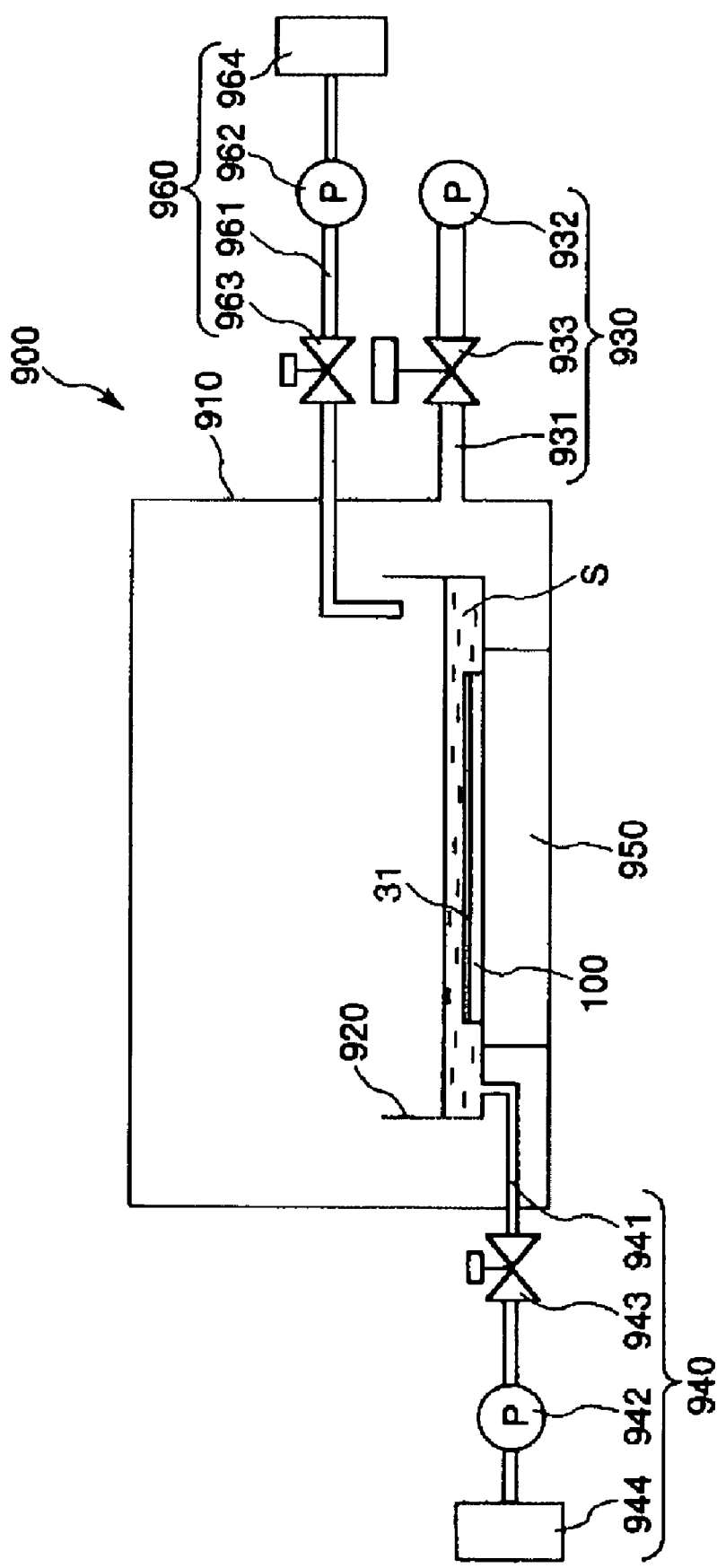
FIG. 3 is a diagram schematically illustrating the structure of a processing apparatus used for a method of manufacturing an electronic device substrate of the invention.

A processing apparatuses 900 shown in FIG. 3 is used in the processes [2] to [4].

The processing apparatus 900 shown in FIG. 3 includes a chamber 910, a stage 950 provided in the chamber 910, a vessel 920 arranged on the stage 950, a liquid supply unit 960 for supplying the treatment liquid S into the vessel 920, a liquid discharging unit 940 for discharging the treatment liquid S from the vessel 920, and an air exhausting unit 930 for exhausting air from the chamber 910.

For example, a heating unit (not shown), such as a heater, is provided on the stage 950.

The air exhausting unit 930 includes a pump 932, an exhaust line connecting the pump 932 and the chamber 910, and a valve 933 provided in the middle of the exhaust line 931.

The liquid discharging unit 940 includes a recovery tank 944 for collecting a treatment liquid S, a liquid discharge line 941 for connecting the recovery tank 944 and the vessel 920, and a pump 942 and a valve 943 provided in the middle of the liquid discharge line 941.

The liquid supply unit 960 includes a storage tank 964 having the treatment liquid S stored therein, a liquid supply line 961 for guiding the treatment liquid S from the storage tank 964 to the vessel 920, a pump 962 and a value 963 provided in the middle of the liquid supply line 961.

Heading units (not shown), such as heaters, are provided in the liquid discharging unit 940 and the liquid supply unit 960 to heat the treatment liquid S.

Next, the above-mentioned processes will be sequentially described below.

[1] Process of Forming Inorganic Oxide Film (First Process)

First, the inorganic oxide film 31 is formed on the base member 100 (a surface of the substrate 9) by an oblique deposition method. The inorganic oxide film 31 having a plurality of pores 30 is obtained by the oblique deposition method.

In this case, it is possible to adjust an angle formed between the pores 30 and the upper surface of the base member 100 by appropriately setting an angle where an inorganic oxide vaporized from a vapor source reaches the upper surface of the base member 100.

It is preferable that the base member 100 be separated from the vapor source as far as possible. A sufficient separation distance-between the base member 100 and the vapor source causes the inorganic oxide vaporized from the vapor source to reach the base member 100 substantially in the same direction. In this way, the inorganic oxide film 31 having a high degree of alignment is obtained.

[2] Process of Dipping Inorganic Oxide Film into Treatment Liquid (Second Process)

Then, the base member 100 having the inorganic oxide film 31 formed thereon is dipped into the treatment liquid S containing the above-mentioned alcohol.

More specifically, the chamber 910 is opened, and the base member 100 having the inorganic oxide film 31 formed thereon is carried into the chamber to be arranged in the vessel 920.

Subsequently, the chamber 910 is closed and the pump 962 is operated. In this state, the valve 963 is opened to cause the treatment liquid S to be supplied from the storage tank 964 to the vessel 920 through the liquid supply line 961.

When a predetermined amount of treatment liquid S, that is, a sufficient amount of treatment liquid S to completely immerge the base member 100, is supplied into the vessel 920, the pump 962 stops and the valve 963 is closed.

In this case, alcohol may be in a liquid, solid, or semisolid state at room temperature.

When alcohol that is in a liquid state at room temperature is used, the alcohol (substantially 100% alcohol) can be used for the treatment liquid S, or a material obtained by mixing alcohol with a proper solvent can be used for the alcohol.

When the alcohol that is in a solid or semisolid state at room temperature is used, the solid or semisolid alcohol can be heated to be used for the treatment liquid S, or a material obtained by mixing alcohol with a proper solvent can be used for the alcohol.

When alcohol is mixed with a solvent or is dissolved thereinto, a solvent capable of being mixed with alcohol or dissolving the alcohol and having lower polarity than that of alcohol is selected. In this way, it is possible to prevent a solvent from hindering the reaction between alcohol and the hydroxyl group of the inorganic oxide film 31 in the subsequent process [4], and thus to reliably generate a chemical reaction.

[3] Process of Infiltrating Treatment Liquid into Inorganic Oxide Film (Third Process)

Next, pressure in the chamber 910 (a space where the treatment liquid S is placed) is reduced to infiltrate the treatment liquid S into the pores 30 of the inorganic oxide film 31.

More specifically, the chamber 910 is closed and the pump 932 is operated. In this state, the valve 933 is closed to cause gas to be exhausted from the chamber 910 to the outside of the processing apparatus 900 through the exhaust line 931.

When the pressure in the chamber 910 is gradually reduced, vapor (for example, air) is removed from the treatment liquid S and the pores 30 of the inorganic oxide film 31, and the treatment liquid S is permeated into the pores 30.

When the pressure in the chamber 910 reaches a predetermined value, the pump 932 stops, and the valve 933 is closed.

The pressure in the chamber 910 (the space), that is, a degree of vacuum in the chamber 910 is preferably in the range of about $1\times10^{-4}$ to $1\times10^{4}$ Pa, more preferably, about $1\times10^{-2}$ to $1\times10^{3}$ Pa. In this way, air is sufficiently removed from the pores 30 of the inorganic oxide film 31, which makes it possible to infiltrate a sufficient amount of treatment liquid S into the pores 30.

Then, the pump 942 is operated. In this state, the valve 943 is closed to cause the remaining treatment liquid S in the chamber 920 to be collected to the recovery tank 944 through the liquid discharge line 941.

Subsequently, when almost the entire treatment liquid S is collected from the vessel 920, the pump 942 stops, and the valve 943 is closed.

[4] Reacting Process (Fourth Process)

Next, alcohol is chemically bonded (ether bond) to the surface of the inorganic oxide film 31 and the inner surfaces of the pores 30.

More specifically, the heating unit provided on the stage 950 is operated to heat the base member 100 having the inorganic oxide film 31 formed thereon.

In this way, an esterification reaction occurs between the hydroxyl group existing in the surface of the inorganic oxide film 31 and the inner surfaces of the pores 30 and the hydroxyl group included in alcohol to cause the alcohol to be chemically bonded to the surface of the inorganic oxide film 31 and the inner surfaces of the pores 30.

As a result, the film 32 having a main skeletal portion of alcohol as a main component is formed along the surface of the inorganic oxide film 31 and the inner surfaces of the pores 30, so that the alignment film 3A is formed.

Before the heating is performed, pressure in the chamber 910 may be reduced again, if necessary.

The base member 100 is heated at a temperature of about 80° C. to 250° C., preferably, about 100 to 200° C. However, the heating temperature is not limited to the above-mentioned temperature. When the heating temperature is low, a sufficient chemical bond between the inorganic oxide film 31 and alcohol may not occur according to the kind of alcohol or the kind of an inorganic oxide film. When the heating temperature is raised higher than the upper limit, the effect is not improved corresponding to the increase in the heating temperature.

Further, the substrate 100 is preferably heated for about 20 to 180 minutes, and more preferably, for about 40 to 100 minutes. However, the heating time of the substrate 100 is not limited thereto. When the heating time is excessively long, there is a fear that a sufficient amount of alcohol may not be chemically bonded to the inorganic oxide film 31 due to conditions other than the heating temperature. Meanwhile, when the heating time is longer than the upper limit, the effect is not improved corresponding to the increase in the heating time.

As described above, heating is used to react the hydroxyl group existing in the surface of the inorganic oxide film 31 and the inner surfaces of the pores 30 with alcohol, which makes it possible to easily and reliably perform the reaction.

The reaction can occur by, for example, radiation of ultraviolet rays or radiation of infrared rays, in addition to the heating. In this case, mechanisms (units) required for performing the processes are provided in the processing apparatus 900.

The method of forming the alignment film 3A has been described above. The above is similarly applied to a method of forming the alignment film 4A.

Second Embodiment

Next, a second embodiment of the liquid crystal panel according to the invention will be described below.

Figure 4:
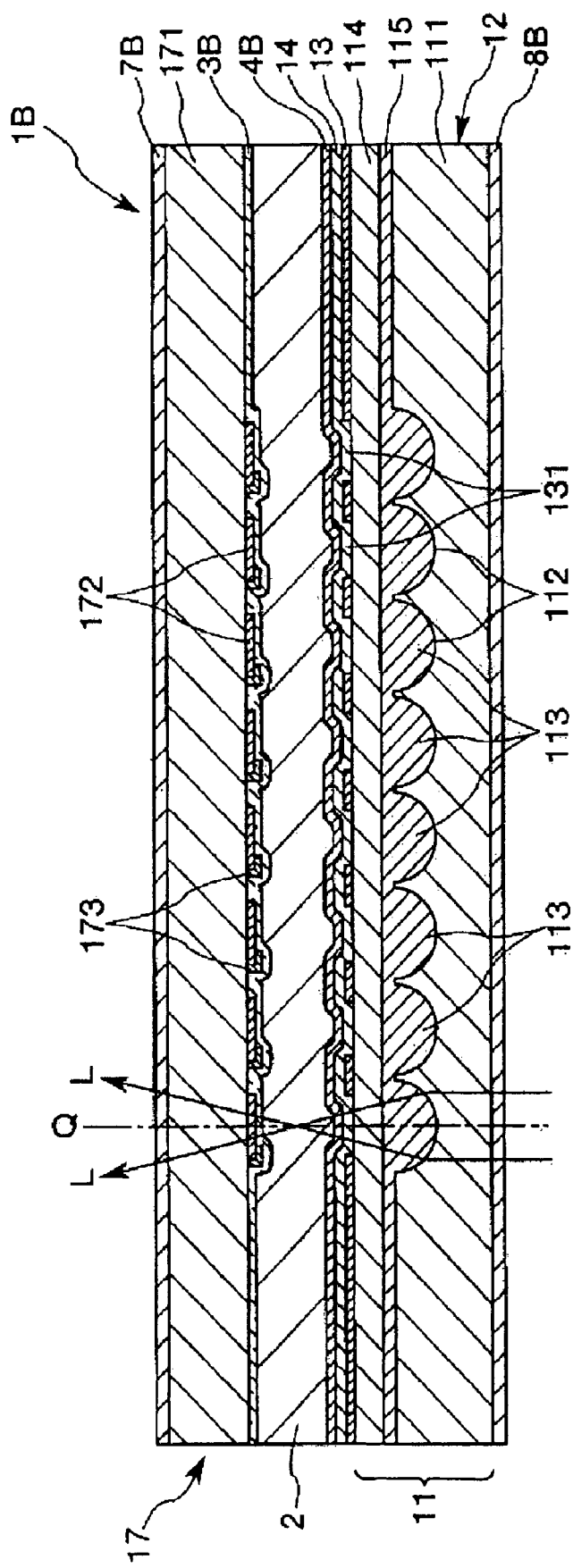
FIG. 4 is a longitudinal cross-sectional view schematically illustrating a second embodiment of the liquid crystal panel of the invention.

FIG. 4 is a longitudinal cross-sectional view schematically illustrating the second embodiment of the liquid crystal panel according to the invention. In FIG. 4, for example, a sealing material and wiring lines are not shown. In addition, in the following description, an upper part of FIG. 4 is referred to as an upper side, and a lower part thereof is referred to as a lower side.

Hereinafter, the second embodiment will be described, centered on a difference from the first embodiment. In the second embodiment, a description of the same matters as those in the first embodiment will be omitted.

A liquid crystal panel (a TFT liquid crystal panel) 1B shown in FIG. 4 includes a TFT substrate (a liquid crystal driving substrate) 1B, an alignment film 3B bonded to the TFT substrate 17, a liquid crystal panel counter substrate 12, an alignment film 4B bonded to the liquid crystal panel counter substrate 12, a liquid crystal layer 2 containing liquid crystal molecules injected into a space between the alignment film 3B and the alignment film 4B, a polarizing film 7B bonded to an outer surface (an upper surface) of the TFT substrate (the liquid crystal driving substrate) 17, and a polarizing film 8B bonded to an outer surface (a lower surface) of the liquid crystal panel counter substrate 12.

In this structure, the TFT substrate 17 and the alignment film 3B form an electronic device substrate of the invention, and the liquid crystal panel counter substrate 12 and the alignment film 4B form another electronic device substrate of the invention.

The alignment films 3B and 4B have the same structures as those of the alignment films 3A and 4A in the first embodiment, and the polarizing films 7B and 8B have the same structures as those of the polarizing films 7A and 8A in the first embodiment.

The liquid crystal panel counter substrate 12 includes a microlens substrate 11, a black matrix 13 which is provided on an outer layer 114 of the microlens substrate 11 and has openings 131 formed therein, and a transparent conductive film (a common electrode) 14 provided on the outer surface 114 so as to cover the black matrix 13.

The microlens substrate 11 includes a substrate 111 having a plurality (a large number) of concave portions 112 (concave portions for microlenses) 112 each having a concave curved surface, a resin layer (an adhesive layer) 115 formed on a surface of the substrate 111 having the concave portions 112 for microlenses provided therein, and the outer layer 114 formed on the resin layer 115.

In the resin layer 115, resin is filled into the concave portions 112 to form microlenses 113.

The substrate 111 having the concave portions for microlenses provided therein is manufactured by a flat mother member (a transparent substrate), and a plurality (a large number) of concave portions 112 are formed in the surface of the substrate 111.

The concave portions 112 can be formed by, for example, a dry etching method or a wet etching method using a mask.

The substrate 111 having the concave portions for microlenses provided therein is formed of, for example, glass.

It is preferable that the linear expansion coefficient of the mother member be substantially equal to that of a glass substrate 171 (for example, the ratio of the linear expansion coefficient of the mother member to the linear expansion coefficient of the glass substrate 171 is in the range of about 1:10 to 10:1). This structure makes it possible to prevent the wrapping, bending, or peeling-off of the two members due to a difference between the linear expansion coefficients of them caused by a variation in temperature in the liquid crystal panel 1B.

From this point of view, it is preferable that the glass substrate 171 and the substrate 111 having the concave portions for microlenses provided therein be formed of the same material. In this case, it is possible to effectively prevent the wrapping, bending, or peeling-off of the two members due to the difference between the linear expansion coefficients of them caused by a variation in temperature.

In particular, when the microlens substrate 11 is used for a TFT liquid crystal panel formed of high-temperature polysilicon, preferably, the substrate 111 having the concave portions for microlenses provided therein is formed of quartz glass. The TFT liquid crystal panel has a TFT substrate as a liquid crystal driving substrate. The TFT substrate is preferably formed of quartz glass whose characteristics are not easily changed under the manufacturing conditions. Therefore, when the substrate 111 having the concave portions for microlenses provided therein is formed of quartz glass, it is possible to effectively prevent the wrapping, bending, or peeling-off of the members and thus obtain the TFT liquid crystal panel 1B having high stability.

The resin layer (the adhesive layer) 115 is provided on the upper surface of the substrate 111 so as to cover the concave portions 112 for microlens.

A material forming the resin layer 115 is filled into the concave portions 112 to form the microlenses 113.

The resin layer 115 can be formed of, for example, resin (adhesive) having a refractive index higher than that of a material forming the substrate 111 having the concave portions for microlenses provided therein. For example, the resin layer 115 can be formed of an ultraviolet-curable resin, such as an acryl-based resin or an epoxy-based resin.

The flat outer layer 114 is formed on the upper surface of the resin layer 115.

The outer layer (glass layer) 114 can be formed of, for example, glass. In this case, it is preferable that the linear expansion coefficient of the outer layer 114 be substantially equal to that of the substrate 111 having the concave portions for microlenses provided therein (for example, the ratio of the linear expansion coefficient of the outer layer 114 to the linear expansion coefficient of the substrate 111 is in the range of about 1:10 to 10:1). This structure makes it possible to prevent the wrapping, bending, or peeling-off of the outer layer 114 and the substrate 111 due to a difference between the linear expansion coefficients of then. When the outer layer 114 and the substrate 111 having the concave portions for microlenses provided therein are formed of the same material, the above-mentioned effects can be more effectively obtained.

When the microlens substrate 11 is used for a liquid crystal panel, in order to necessary optical characteristics, the average thickness of the outer layer 114 is preferably in the range of about 5 to 1000 μm, and more preferably, in the range of about 10 to 150 μm.

The outer layer (barrier layer) 114 can be formed of, for example, ceramics. For example, as the ceramics, any of the following materials can be used: nitride-based ceramics, such as AlN, SiN, TiN, and BN, oxide-based ceramics, such as $Al_2O_3$ and $TiO_2$, and carbide-based ceramics, such as WC, TiC, ZrC, and TaC.

When the outer layer 114 is formed of ceramics, the average thickness of the outer layer 114 is preferably in the range of 20 nm to 20 μm, and more preferably, in the range of 40 nm to 1 μm. However, the average thickness of the outer layer 114 is not limited to the above-mentioned values.

The outer layer 114 may be omitted, if necessary.

The black matrix 13 has a light shielding property, and is formed of a metallic material, such as Cr, Al, an Al alloy, Ni, Zn, and Ti, or resin having carbon or titanium dispersed therein.

The transparent conductive film 14 has a conductive property and is formed of, for example, indium tin oxide (ITO), indium oxide (IO), or tin oxide ($SnO_2$).

The TFT substrate 17 is a substrate for driving (controlling the alignment of) the liquid crystal molecules included in the liquid crystal layer 2, and includes a glass substrate 171, a plurality (a large number) of pixel electrodes 172 arranged in a matrix on the glass substrate 171, and a plurality (a large number) of thin film transistors (TFTs) 173 corresponding to the pixel electrodes 172.

It is preferable that the glass substrate 171 be formed of quartz glass for the above-mentioned reason.

A charge or discharge between the pixel electrodes 172 and the transparent conductive film 14 (the common electrode) causes the liquid crystal molecules of the liquid crystal layer 2 to be driven. The pixel electrodes 172 are formed of, for example, the same material as that forming the transparent conductive film 14.

The thin film transistors 173 are connected to the corresponding pixel electrodes 172. The thin film transistors 173 are also connected to a control circuit (not shown) to control a current supplied to the pixel electrodes 172. In this way, the charge or discharge of the pixel electrodes 172 is controlled.

The alignment film 3B is bonded to the pixel electrodes 172 of the TFT substrate 17, and the alignment film 4B is bonded to the transparent conductive film 14 of the liquid crystal panel counter substrate 12.

The liquid crystal layer 2 contains the liquid crystal molecules (liquid crystal material), and the alignment of the liquid crystal molecules is controlled by the charge of discharge of the pixel electrodes 172.

In the liquid crystal panel 1B, generally, one pixel is composed of one microlens 113, one opening 131 of the black matrix 13 corresponding to an optical axis Q of the microlens 113, one pixel electrode 172, and one thin film transistor 173 connected to the pixel electrode 172.

Light L incident from the liquid crystal panel counter substrate 12 passes through the substrate 111 having the concave portions for microlenses formed therein, and is then condensed by the microlens 113. Then, the condensed light sequentially passes through the resin layer 115, the outer layer 114, the opening 131 of the black matrix 13, the transparent conductive film 14, the liquid crystal layer 2, the pixel electrode 172, and the glass substrate 171.

At that time, when the incident light L passes through the liquid crystal layer 2, the polarizing film 8B provided on the light incident side of the microlens substrate 11 causes the incident light L to be linearly polarized.

In this case, the polarized direction of the incident light L is controlled to correspond to the alignment state of the liquid crystal molecules of the liquid crystal layer 2. The incident light L passing through the liquid crystal panel 1B and the polarizing film 7B makes it possible to control the brightness of emission light.

The liquid crystal panel 1B has the microlenses 113. The incident light L is condensed by the microlenses 113, and the condensed light passes through the openings 131 of the black matrix 13.

Meanwhile, the incident light L is shielded in portions of the black matrix 13 where the openings 131 are not formed. Therefore, in the liquid crystal panel 1B, it is possible to prevent the leakage of light from portions other than the pixels and thus to prevent the attenuation of the incident light L in the pixels. As a result, the liquid crystal panel 1B has high transmittance in the pixels.

For example, the liquid crystal panel 1B can be manufactured by the following method.

First, the TFT substrate 17 and the liquid crystal panel counter substrate 12 are prepared by a well-known method.

Then, the alignment films 3B and 4B are formed on these substrates by a method of manufacturing an electronic device substrate of the invention, thereby forming electronic device substrates of the invention.

Subsequently, these substrates are bonded to each other by a sealing member (not shown), and liquid crystal is injected into a space formed between the substrates through an injection hole (not shown) formed in the sealing member. Then, the injection hole is sealed.

In the liquid crystal panel 1B, the TFT substrate is used as the liquid crystal driving substrate. However, substrates other than the TFT substrate, such as a TFD substrate and an STN substrate, may be used as the liquid crystal driving substrate.

Next, an electronic apparatus (a liquid crystal display device) including the liquid crystal panel 1A according to the invention will be described below in detail with reference to FIGS. 5 to 7.

Figure 5:
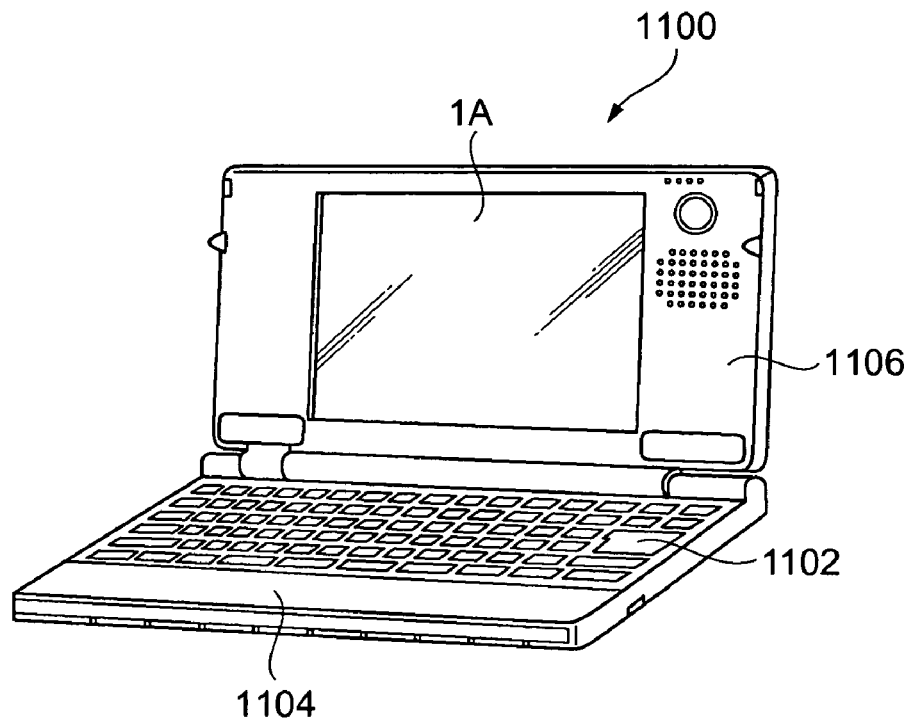
FIG. 5 is a perspective view illustrating the structure of a portable personal computer (or a notebook computer), which is an example of an electronic apparatus according to the invention.

FIG. 5 is a perspective view illustrating the structure of a portable personal computer (a notebook computer) which is an electronic apparatus to which the invention is applied.

In FIG. 5, a personal computer 1100 includes a main body portion 1104 provided with a keyboard 1102 and a display device unit 1106. The display unit 1106 is rotatably supported by the main body portion 1104 through a hinge structure.

In the personal computer 1100, the display unit 1106 includes the liquid crystal panel 1A and a backlight (not shown) Light emitted from the backlight passes through the liquid crystal panel 1A, thereby displaying images (information).

Figure 6:
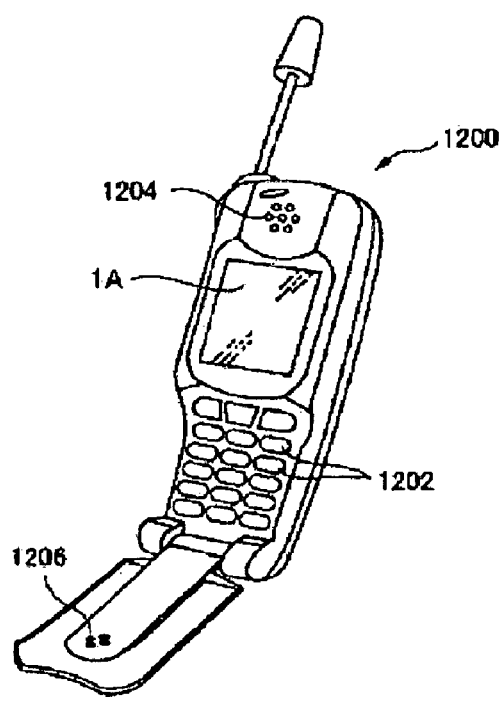
FIG. 6 is a perspective view illustrating the structure of a cellular phone (including PHS), which is an example of the electronic apparatus according to the invention.

FIG. 6 is a perspective view illustrating the structure of a cellular phone (including PHS), which is an electronic apparatus to which the invention is applied.

In FIG. 6, a cellular phone 1200 includes a plurality of operating buttons 1202, an earpiece 1204, a mouthpiece 1206, the liquid crystal panel 1A, and a backlight (not shown).

Figure 7:
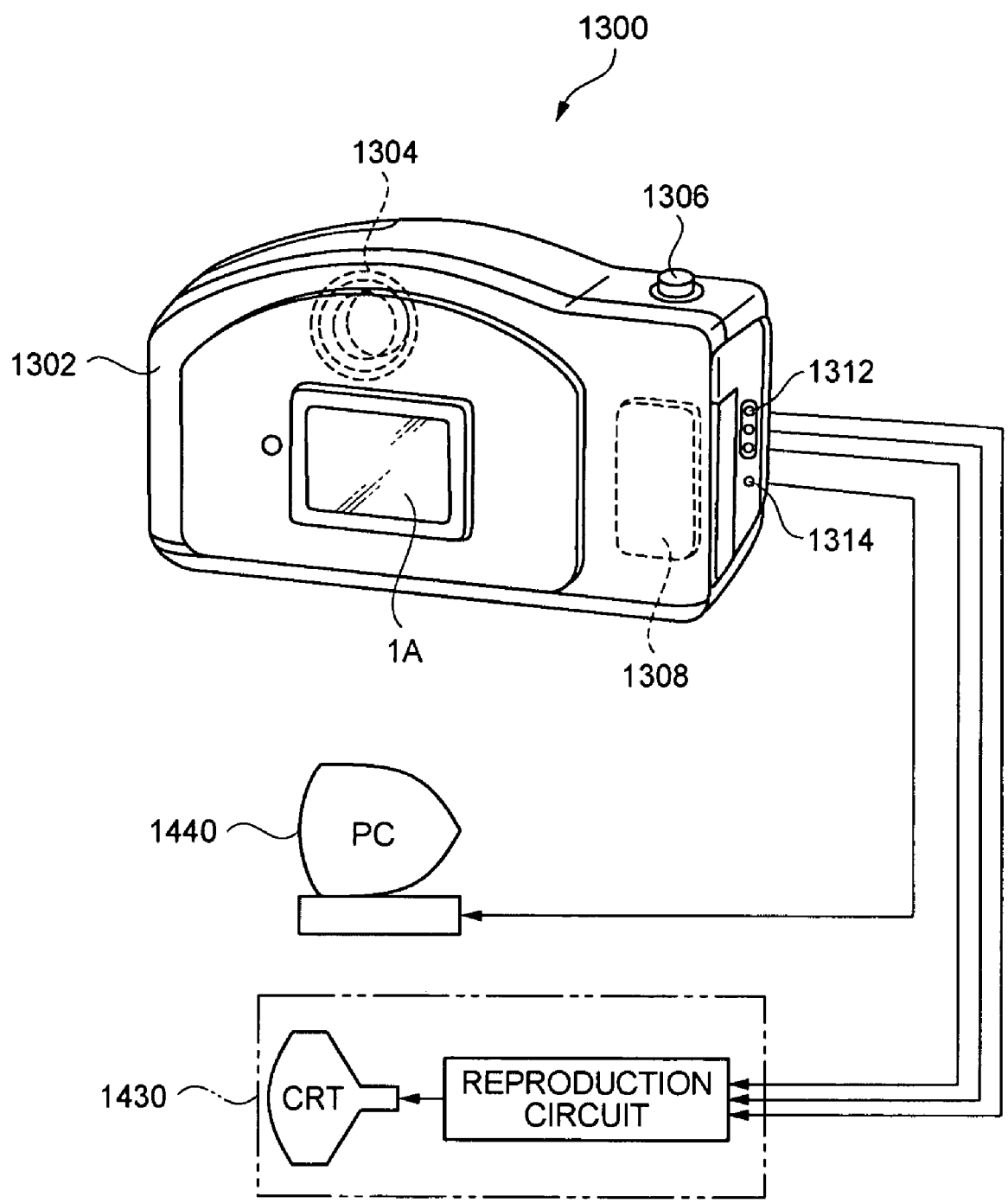
FIG. 7 is a perspective view illustrating the structure of a digital still camera, which is an example of the electronic apparatus according to the invention.

FIG. 7 is a perspective view illustrating the structure of a digital still camera, which is an electronic apparatus to which the invention is applied. FIG. 7 also schematically shows a connection between the digital still camera and an external apparatus.

A general camera exposes a silver photographic film by the light image of a subject. In contrast, a digital still camera 1300 photo-electrically converts the optical image of a subject by an image pick-up device, such as a charge coupled device (CCD), to generate image signals.

The liquid crystal panel 1A and a backlight (not shown) are provided on the rear surface of a case 1302 of the digital still camera 1300. A display operation is performed on the basis of the image signals captured by the CCD. The liquid crystal panel 1A functions as a finder for displaying a subject as an electronic image.

A circuit board 1308 is provided in the case. A memory for storing image signals is provided on the circuit board 1308.

A light-receiving unit 1304 including, for example, an optical lens (an image capturing optical system) or a CCD is provided on the front side of the case 1302 (on the rear side of FIG. 7).

When a photographer recognizes the image of a subject displayed on the liquid crystal panel 1A and pushes a shutter button 1306, the image signal of the CCD at that time is transmitted to the memory of the circuit board 1308 and is then stored therein.

In the digital still camera 1300, a video signal output terminal 1312 and an input/output terminal 1314 for data communication are provided at the side of the case 1302. As shown in FIG. 7, a television monitor 1430 is connected to the video signal output terminal 1312, and a personal computer 1440 is connected to the input/output terminal 1314 for data communication, if necessary. Furthermore, a predetermined operation causes the image signal stored in the memory of the circuit board 1308 to be output to the television monitor 1430 or the personal computer 1440.

Next, a description will be made of an electronic apparatus (a liquid crystal projector) using the liquid crystal panel 1B, which is an example of the electronic apparatus of the invention.

Figure 8:
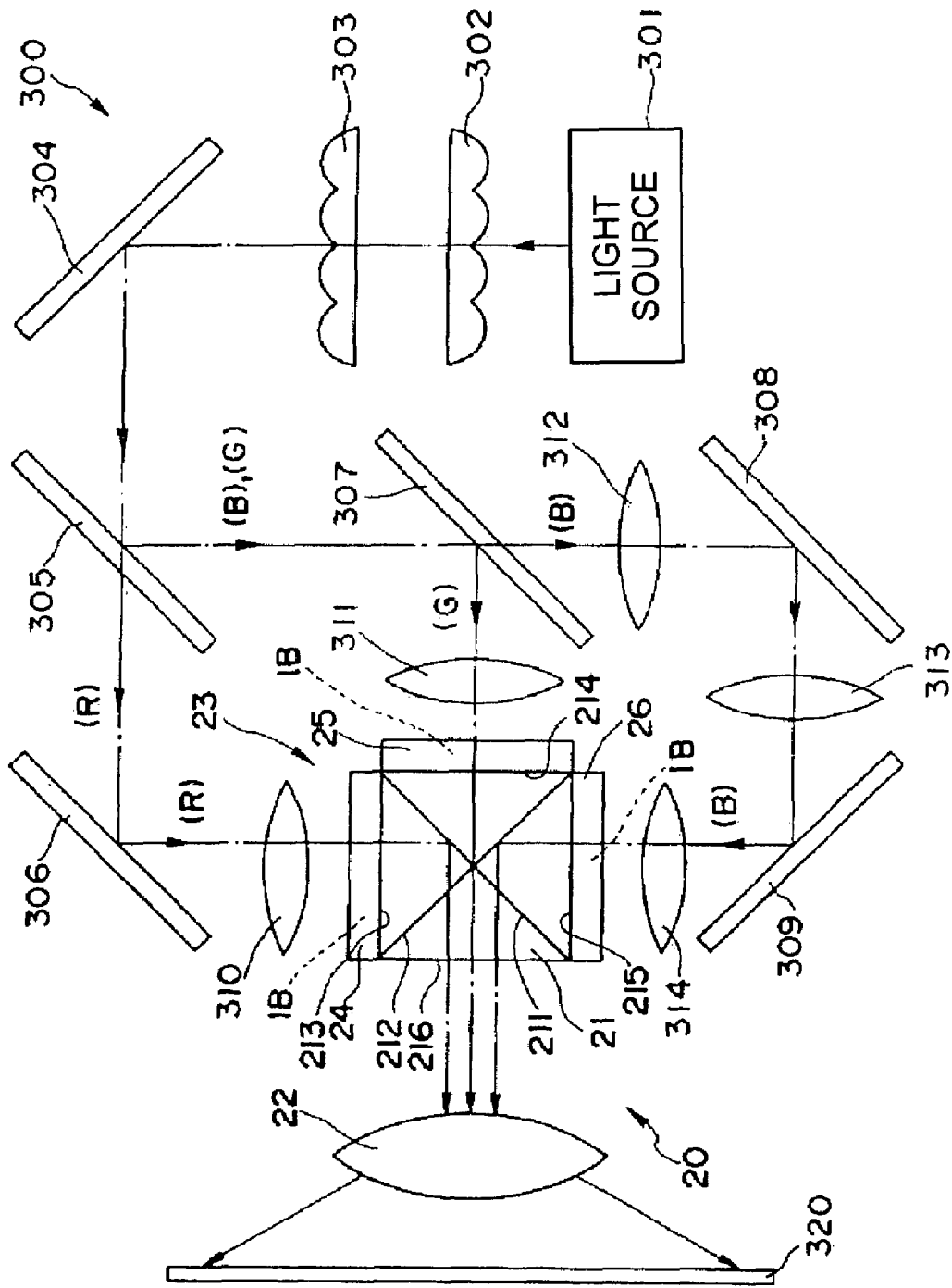
FIG. 8 is a diagram schematically illustrating an optical system of a projection display apparatus, which is an example of the electronic apparatus according to the invention.

FIG. 8 is a diagram schematically illustrating an optical system of an electronic apparatus (a projection display apparatus) of the invention.

As shown in FIG. 8, a projection display apparatus 300 includes an illumination optical system having a light source 301 and a plurality of integrator lenses, a color separating optical system (a light guide optical system) having, for example, a plurality of dichroic mirrors, a (red) liquid crystal light valve 24 (a liquid crystal light shutter array) corresponding to red, a (green) liquid crystal light valve 25 (a liquid crystal light shutter array) corresponding to green, a (blue) liquid crystal light valve 26 (a liquid crystal light shutter array) corresponding to blue, a dichroic prism (a color combining optical system) 21 composed of a dichroic mirror surface 211 which reflects only a red light component and a dichroic mirror surface 212 which reflects only a blue light component, and a projection lens (a projection optical system) 22.

The illumination optical system includes integrator lenses 302 and 303. The color separating optical system includes, mirrors 304, 306, and 309, a dichroic mirror 305 that reflects blue and green light components (transmits only a red light component), a dichroic mirror 307 that reflects only the green light component, a dichroic mirror 308 that reflects only the blue light component (a mirror reflecting the blue light component), and condensing lenses 310, 311, 312, 313, and 314.

The liquid crystal light valve 25 includes the liquid crystal panel 1B. The liquid crystal light valves 24 and 26 have the same structure as that of the liquid crystal light valve 25. The liquid crystal panels 1B provided in the liquid crystal light valves 24, 25, and 26 are connected to a driving circuit (not shown).

In the projection display apparatus 300, the dichroic prism 21 and the projection lens 22 form an optical block 20. In addition, a display unit 23 includes the optical block 20 and the liquid crystal light valves 24, 25, and 26 fixed to the dichroic prism 21.

Next, the operation of the projection display apparatus 300 will be described below.

A white light component (a white light beam) emitted from a light source 301 passes through the integrator lenses 302 and 303. The light intensity (luminance distribution) is made uniform by the integrator lenses 302 and 303. It is preferable that the white light component emitted from the light source 301 have a relatively high light intensity. In this way, it is possible to improve the resolution of an image formed on a screen 320. Further, since the projection display apparatus 300 includes the liquid crystal panel 1B having high light resistance, it is possible to obtain high stability even when light having high intensity is emitted from the light source 301.

The white light component passing through the integrator lenses 302 and 303 is reflected to the left side of FIG. 8 by the mirror 304. A blue light component (B) and a green light component (G) of the reflected light are reflected to the downward direction of FIG. 8 by the dichroic mirror 305. A red light component (R) passes through the dichroic mirror 305.

The red light component passing through the dichroic mirror 305 is reflected to the downward direction of FIG. 8 by the mirror 306. The reflected light is shaped by the condensing lens 310 and is then incident on the red liquid crystal light valve 24.

The green light component of the blue and green light components reflected by the dichroic mirror 305 is reflected to the left side of FIG. 8 by the dichroic mirror 307, and the blue light component passes through the dichroic mirror 307.

The green light component reflected by the dichroic mirror 307 is shaped by the condensing lens 311, and is then incident on the green liquid crystal light valves 25.

The blue light component passing through the dichroic mirror 307 is reflected to the left side of FIG. 8 by the dichroic mirror (or a mirror) 308 and the reflected light is further reflected to the downward direction of FIG. 8 by the mirror 309. The blue light component is shaped by the condensing lenses 312, 313, and 314 and is then incident on the blue liquid crystal light valve 26.

The white light emitted from the light source 301 is separated into the three primary colors of red, green, and blue by a color separating optical system, and the separated light components are guided to the corresponding liquid crystal light valves and are then incident thereon.

In this case, pixels (thin film transistors 173 and pixel electrodes 172 connected to the transistors 173) of the liquid crystal panel 1B provided in the liquid crystal light valve 24 are controlled (are turned on or off), that is, modulated by a driving circuit (a driving unit) operated on the basis of red image signals.

Similarly, the green and blue light components are incident on the liquid crystal light valves 25 and 26, respectively, and are modulated by the liquid crystal panels 1B thereof, thereby forming green and blue images. In this case, pixels of the liquid crystal panel 1B of the liquid crystal light bulb 25 are controlled by a driving circuit operated on the basis of green image signals. Similarly, pixels of the liquid crystal panel 1B of the liquid crystal light bulb 26 are controlled by a driving circuit operated on the basis of blue image signals.

In this way, the red, green and blue light components are respectively modulated by the liquid crystal light valves 24, 25 and 26 to form red, green, and blue images.

The red image formed by the liquid crystal light valve 24, that is, a red light component emitted from the liquid crystal light valve 24 is incident on the dichroic prism 21 through the surface 213 and is reflected to the left side of FIG. 8 by the dichroic mirror surface 211. Then, the reflected light passes through the dichroic mirror surface 212, and is emitted from the emission surface 216.

The green image formed by the liquid crystal light valve 25, that is, the green light component emitted from the liquid crystal light valve 25 is incident on the dichroic prism 21 through the surface 214. Then, the incident light passes through the dichroic mirror surfaces 211 and 212 and is then emitted from the emission surface 216.

The blue image formed by the liquid crystal light valve 26, that is, the blue light component emitted from the liquid crystal light valve 26 is incident on the dichroic prism 21 through the surface 215 and is reflected to the left side of FIG. 8 by the dichroic mirror surface 212. Then, the reflected light passes through the dichroic mirror surface 21, and is then emitted from the emission surface 216.

As described above, the red, green and blue light components emitted from the liquid crystal light valves 24, 25, and 26, that is, the red, green, and blue images respectively formed by the liquid crystal light vales 24, 25, and 26 are synthesized into a color image by the dichroic prism 21. The color image is projected (enlarged and projected) onto the screen 320 placed at a predetermined position by the projection lens 22.

In this embodiment, the projection display apparatus 300 includes three liquid crystal light valves, and the liquid crystal panels 1B of the invention are applied to the three liquid crystal light valves. However, at least one of the three liquid crystal light valves may be composed of the liquid crystal panel 1B. In this case, it is preferable that the liquid crystal panel 1B be applied to the blue liquid crystal light valve.

In addition to the personal computer (the portable personal computer) shown in FIG. 5, the cellular phone shown in FIG. 6, the digital still camera shown in FIG. 7, and the projection display apparatus shown in FIG. 8, the electronic apparatus of the invention includes, for example, a television set, a video camera, a view-finder-type or monitor-direct-view-type videotape recorder, a car navigation system, a pager, an electronic organizer (includes a communication function), an electronic dictionary, an electronic calculator, an electronic game machine, a word processor, a workstation, a television phone, a security television monitor, an electronic binoculars, a POS terminal, and apparatuses equipped with touch panels (for example, an automatic teller machine of a financial institution and an automatic ticket machine), medical instruments (for example, an electronic thermometer, an electronic sphygmomanometer, an electronic blood-sugar measuring instrument, an electrocardiograph, an ultrasonic diagnostic apparatus, and a display apparatus for an endoscope), a fish detector, various measuring instruments, measuring gauges (for example, gauges for a vehicle, an airplane, and a ship), and a flight simulator. In addition, it goes without saying that the liquid crystal panel of the invention can be applied to display units or monitors of these electronic apparatuses.

The method of treating the inorganic oxide film, the electronic device substrate, the method of manufacturing the electronic device substrate, the liquid crystal panel, and the electronic apparatus according to the invention have been described above with reference to the drawings. However, the invention is not limited thereto.

For example, one or more processes may be added to the method of treating the inorganic oxide film and the method of manufacturing the electronic device substrate.

Further, the method of treating the inorganic oxide film according to the invention can be applied to various types of inorganic oxide films.

For example, in the electronic device substrate, the liquid crystal panel, and the electronic apparatus according to the invention, the structure of the components can be replaced with any structure capable of exhibiting the same functions as those of the components, or an arbitrary structure can be added to the structure of the invention.

Furthermore, the electronic device substrate of the invention can be applied to a liquid crystal panel in which a pair of electrodes for applying a voltage to the liquid crystal layer is provided on the same substrate, in addition to the liquid crystal panel described in the above-mentioned embodiment.

Further, in the above-mentioned embodiment, the electronic device substrate of the invention is applied to the liquid crystal panel, but the invention is not limited thereto. For example, the electronic device substrate can also be applied to an organic transistor. In this case, the use of the electronic device substrate makes it possible to regulate the arrangement direction of an organic semiconductor layer and thus to improve carrier mobility.

EXAMPLES

Next, examples of the invention will be described below.

1. Manufacture of Electronic Device Substrate:

Sample No. 1

<1> First, a glass substrate (having a size of 2.5 cm×2.5 cm) is prepared, and the glass substrate is set in a vapor deposition apparatus, with a surface inclined at an angle of 70° with respect to a vapor deposition source.

Then, the pressure of the vapor deposition apparatus is reduced ($1\times10^{-4}$ Pa) to perform oblique deposition of $SiO_2$, thereby manufacturing a substrate having an oblique deposition film (an inorganic oxide film).

In the oblique deposition film, pores are formed at an angle of 50° with respect to the upper surface of the glass substrate.

<2> Next, the substrate having the oblique deposition film formed thereon is heated at a temperature of 200° C. for 90 minutes in a clean oven, and the heated substrate is left under the dry nitrogen atmosphere.

<3> 2-propanol is prepared, and ionic impurities thereof are removed by using a filter. Then, water is removed therefrom by nitrogen bubbling, thereby adjusting a treatment liquid.

<4> Next, the substrate having the oblique deposition film formed thereon is carried into the processing apparatus shown in FIG. 3 and is then arranged in a vessel (made of polytetrafluoroethylene), with the oblique deposition film facing upward.

Then, a chamber is closed, and the prepared treatment liquid is supplied into the vessel such that the substrate having the oblique deposition film is dipped into the treatment liquid.

<5> In the process <4>, the pressure of the chamber is reduced to 100 Pa.

In this way, gas in the pores of the oblique deposition film is substituted for the treatment liquid. That is, the treatment liquid is infiltrated into the pores.

<6> Next, the surplus treatment liquid is discharged from the vessel, and the pressure of the chamber is reduced to 100 Pa. Then, the substrate is heated at a temperature of 150° C. for one hour.

In this way, 2-propanol is chemically bonded to the surface of the oblique deposition film and the inner surfaces of the pores.

<7> After the heating is finished, a cooling operation is performed on the substrate under the reduced pressure.

In this way, an electronic device substrate is obtained.

The obtained alignment film has an average thickness of 45 nm.

Sample No. 2

In a sample No. 2, an electronic device substrate is manufactured in the same manner as that in the sample No. 1 except that 1-pentanol is used instead of 2-propanol.

An alignment film obtained in the sample No. 2 has an average thickness of 45 nm.

Sample No. 3

In a sample No. 3, an electronic device substrate is manufactured in the same manner as that in the sample No. 1 except that hexanol is used instead of 2-propanol.

An alignment film obtained in this sample has an average thickness of 45 nm.

Sample No. 4

In a sample No. 4, an electronic device substrate is manufactured in the same manner as that in the sample No. 1 except that 1-decanol is used instead of 2-propanol.

An alignment film obtained in this sample has an average thickness of 48 nm.

Sample No. 5

In a sample No. 5, an electronic device substrate is manufactured in the same manner as that in the sample No. 1 except that 1-octadecanol is used instead of 2-propanol.

Since 1-octadecanol is in a semisolid state at room temperature, it is heated at a temperate of 60° C. to turn to a liquid state. In this state, the processes <3> and <4> are performed.

An alignment film obtained in this sample has an average thickness of 48 nm.

Sample No. 6

In a sample No. 6, an electronic device substrate is manufactured in the same manner as that in the sample No. 1 except that, instead of $SiO_2$, $Al_2O_3$ is obliquely deposited to manufacture a substrate having an oblique deposition film (an inorganic oxide film) formed thereon.

An alignment film obtained in this sample has an average thickness of 45 nm.

Sample No. 7

In a sample No. 7, an electronic device substrate is manufactured in the same manner as that in the sample No. 1 except that the pressure reducing step is omitted in the process <5> and the process <6> is omitted.

An alignment film obtained in this sample has an average thickness of 40 nm.

Sample No. 8

In a sample No. 8, an electronic device substrate is manufactured in the same manner as that in the sample No. 1 except that the pressure reducing step is omitted in the process <5>.

An alignment film obtained in this sample has an average thickness of 45 nm.

Sample No. 9

In a sample No. 9, an electronic device substrate is manufactured in the same manner as that in the sample No. 6 except that the pressure reducing step is omitted in the process <5> and the process <6> is omitted.

An alignment film obtained in this sample has an average thickness of 40 nm.

Sample No. 10

In a sample No. 10, an electronic device substrate is manufactured in the same manner as that in the sample No. 6 except that the pressure reducing step is omitted in the process <5>.

An alignment film obtained in this sample has an average thickness of 45 nm.

2. Evaluation of Alcohol Bonding Rate:

The electronic device substrates of the sample No. 1 and the sample Nos. 6 to 10 are heated at a temperature of 200° C., and gas generated at the time is analyzed by using a gas chromatograph-mass spectrometer (GC-MS; for example 'GC-MS QP5050A' manufactured by Shimadzu Corporation).

From a chart obtained by the GC-MS, the amounts of propylene generated from the electronic device substrates of each sample are calculated by adding up the areas of peaks derived from propylene.

The amounts of the generated propylene are proportional to the amounts of 2-propanol chemically bonded to the oblique deposition film, respectively.

The results are shown in the following Table 1.

TABLE 1

| Sample No. | Ingredients of oblique deposition film | Treatment by treatment liquid | | Amount of generated propylene (relative value) |
|---|---|---|---|---|
| | | Reduction of pressure at the time of dipping | Execution of heating at the time of dipping | |
| 1 (Example) | $SiO_2$ | Executed | Executed | 3.5 |
| 7 (Comparative Example) | | Not executed | Not executed | Smaller than 0.1 |
| 8 (Comparative Example) | | Not executed | Executed | 1.0 |
| 6 (Example) | $Al_2O_3$ | Executed | Executed | 3.2 |
| 9 (Comparative Example) | | Not executed | Not executed | Smaller than 0.1 |
| 10 (Comparative Example) | | Not executed | Executed | 1.0 |

In the Table 1, the amount of propylene generated from the electronic device substrate of the sample No. 8 is regarded as a value of '1.0', and the amounts of propylene generated from the electronic device substrates of the sample Nos. 1 and 7 are represented by relative values to the value.

In addition, the amount of propylene generated from the electronic device substrate of the sample No. 10 is regarded as a value of '1.0', and the amounts of propylene generated from the electronic device substrates of the sample Nos. 6 and 9 are represented by relative values to the value.

As can be apparently seen from the Table 1, in the sample Nos. 8 and 10, a heat treatment makes it possible to increase the amount of alcohol chemically bonded to the oblique deposition film, as compared with the sample Nos. 7 and 9 in which the oblique deposition film is simply dipped into the treatment liquid.

In addition, the Table 1 clearly shows that reducing pressure when the oblique deposition film is dipped into alcohol (the sample Nos. 1 and 6) makes it possible to increase the amount of alcohol chemically bonded to the oblique deposition film. This is because the reduction of pressure causes alcohol to be deeply infiltrated into the pores of the oblique deposition film, so that the amount of alcohol chemically bonded to the inner surfaces of the oblique deposition film increases.

3. Manufacture of Liquid Crystal Panel:

Example 1

First, the same process as that performed in the sample No. 1 is executed to manufacture two electronic device substrates.

Then, a thermosetting adhesive ('ML3804P' manufactured by Nippon Kayaku Co., Ltd.) is printed on the peripheral portion of a surface of one of the electronic device substrates having an alignment film formed thereon, except a liquid crystal injection hole, and the substrates are heated at a temperature of 80° C. for ten minutes to remove a solvent.

The thermosetting adhesive is an epoxy resin containing silica beads having a diameter of about 3 μm dispersed therein.

Then, the other substrate is pressed against the one substrate, with its inner surface having an alignment film formed thereon facing the one substrate, and the two substrates are heated at a temperature of 140° C. for an hour, thereby bonding the two substrates.

Subsequently, the two substrates are arranged such that the alignment directions of the alignment films are reverse to each other.

Next, fluorine-based liquid crystal having negative dielectric anisotropy ('MLC-6610' manufactured by Merck) is injected into a space formed between the two substrates bonded to each other through the liquid crystal injection hole by a vacuum injection method.

Then, an acryl-based UV adhesive ('LDP-204' manufactured by Henkel Japan Ltd.) is applied onto the liquid crystal injection hole, and a UV having a wavelength of 365 nm is radiated onto the UV adhesive with an energy of 3000 mJ/cm$^2$ to harden it, thereby sealing the liquid crystal injection hole.

In this way, a liquid crystal panel is manufactured.

Example 2

A liquid crystal panel is manufactured in the same manner as that in the Example 1 except that the electronic device substrate of the sample No. 2 is used.

Example 3

A liquid crystal panel is manufactured in the same manner as that in the Example 1 except that the electronic device substrate of the sample No. 3 is used.

Example 4

A liquid crystal panel is manufactured in the same manner as that in the Example 1 except that the electronic device substrate of the sample No. 4 is used.

Example 5

A liquid crystal panel is manufactured in the same manner as that in the Example 1 except that the electronic device substrate of the sample No. 5 is used.

Example 6

A liquid crystal panel is manufactured in the same manner as that in the Example 1 except that the electronic device substrate of the sample No. 6 is used.

Comparative Example 1

A liquid crystal panel is manufactured in the same manner as that in the Example 1 except that the electronic device substrate of the sample No. 7 is used.

Comparative Example 2

A liquid crystal panel is manufactured in the same manner as that in the Example 1 except that the electronic device substrate of the sample No. 8 is used.

Comparative Example 3

A liquid crystal panel is manufactured in the same manner as that in the Example 1 except that the electronic device substrate of the sample No. 9 is used.

Comparative Example 4

A liquid crystal panel is manufactured in the same manner as that in the Example 1 except that the electronic device substrate of the sample No. 10 is used.

4. Light Resistance Test of Liquid Crystal Panel:

Each liquid crystal panel manufactured in the Examples and the Comparative Examples is set as the blue liquid crystal light valve of the projection display apparatus shown in FIG. 8. Then, a light source is continuously turned on while the surface of the liquid crystal panel is being maintained at a temperature of 70° C. The time required until display abnormality occurs is measured.

A 130 W UHP lamp (manufactured by Philips Ltd.) is used as the light source.

The results are shown in the following Table 2.

TABLE 2

|  | Ingredient of oblique deposition film | Treatment by treatment liquid | | | Time required until display abnormality occurs (relative value) |
|---|---|---|---|---|---|
|  |  | Number of carbon atoms in alcohol | Reduction of pressure at the time of dipping | Heating after dipping |  |
| Example 1 | SiO$_2$ | 3 | Executed | Executed | 4.9 |
| Example 2 |  | 5 | Executed | Executed | 4.7 |
| Example 3 |  | 6 | Executed | Executed | 3.5 |
| Example 4 |  | 10 | Executed | Executed | 3.1 |
| Example 5 |  | 18 | Executed | Executed | 2.8 |
| Comparative Example 1 |  | 3 | Not executed | Not executed | 0.7 |
| Comparative Example 2 |  | 3 | Not executed | Executed | 1.0 |
| Example 6 | Al$_2$O$_3$ | 3 | Executed | Executed | 4.2 |
| Comparative Example 3 |  | 3 | Not executed | Not executed | 0.7 |
| Comparative Eample 4 |  | 3 | Not executed | Executed | 1.0 |

In the Table 2, when the time required until display abnormality occurs in the liquid crystal panel of the Comparative Example 2 is regarded as a value of '1.0', the time required until display abnormality occurs in the liquid crystal panels of the Examples 1 to 5 and the Comparative Example 1 is represented by relative values to the value.

In addition, when the time required until display abnormality occurs in the liquid crystal panel of the Comparative Example 4 is regarded as a value of '1.0', the time required until display abnormality occurs in the liquid crystal panels of the Example 6 and the Comparative Example 3 is represented by relative values to the value.

As can be apparently seen from the Table 2, in the liquid crystal panels of the examples, the time required until display abnormality occurs is longer than that in the liquid crystal panels of the Comparative Examples.

The table shows that the use of the alcohol having 3 to 5 carbon atoms causes the time required until display abnormality occurs to be prolonged.

This is because the alcohol having a small number of carbon atoms is deeply infiltrated into the pores of the oblique deposition film, so that the amount of alcohol chemically bonded to the inner surfaces of the oblique deposition film increases.

Further, the fluorine-substituted products of various kinds of alcohols are used as alcohols to manufacture the same electronic device substrate and liquid crystal panel as described above, and the evaluation thereof is made in the same manner as described above. In this case, the same results as described above are also obtained.

The entire disclosure of Japanese Patent Application No. 2005-120766, filed Apr. 19, 2005 is expressly incorporated by reference herein.

What is claimed is:

1. An electronic device substrate comprising:
   a substrate; and
   an alignment film which is formed on a surface of the substrate,
   wherein the alignment film is formed by chemically bonding an alcohol selected from the group consisting of propanol, butanol, and pentanol to a surface of an inorganic oxide film having a plurality of pores therein which is formed by an oblique deposition method and inner surfaces of the pores.

* * * * *